(12) United States Patent
Adlerstein

(10) Patent No.: US 7,202,673 B1
(45) Date of Patent: Apr. 10, 2007

(54) TUNED MMIC PROBE PADS

(75) Inventor: Michael G. Adlerstein, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/460,311

(22) Filed: Jul. 27, 2006

(51) Int. Cl.
*G01R 27/28* (2006.01)

(52) U.S. Cl. .................................. 324/655; 324/633

(58) Field of Classification Search ................ 324/637, 324/158.1, 633, 655
See application file for complete search history.

(56) References Cited

U.S. PATENT DOCUMENTS

| | | | |
|---|---|---|---|
| 4,719,434 A * | 1/1988 | Scott et al. | 333/32 |
| 5,351,001 A * | 9/1994 | Kornrumpf et al. | 324/158.1 |
| 5,457,399 A | 10/1995 | Krumm | |
| 6,049,219 A * | 4/2000 | Hwang et al. | 324/765 |

* cited by examiner

Primary Examiner—Walter Benson
(74) Attorney, Agent, or Firm—Daly, Crowley, Mofford & Durkee, LLP

(57) ABSTRACT

A microwave integrated circuit chip having microwave transmission line coupled to an input of a microwave circuitry: The microwave transmission line comprises: a substrate; a strip conductor disposed on a first surface of the substrate, such strip conductor having an input signal pad at one end thereof, and a ground plane disposed on a second, opposite surface of the substrate. The microwave circuitry has capacitive input impedance. The chip includes a via passing from the first surface of the substrate, through the substrate, to the ground plane. A test probe ground pad is disposed on the first surface of the substrate and spaced from a portion of the via disposed on the first surface of the substrate. An electrical conductor is disposed on the first surface of the substrate extending from the portion of the via disposed on the first surface of the substrate via to the test probe ground pad, such electrical conductor providing an inductive impedance selected to provide a resonance with the capacitive input impedance of the microwave circuitry.

6 Claims, 6 Drawing Sheets

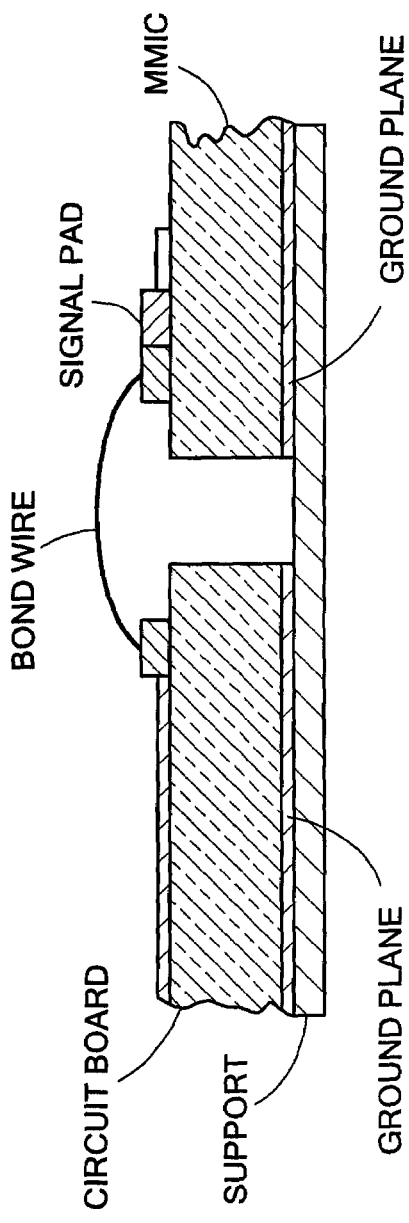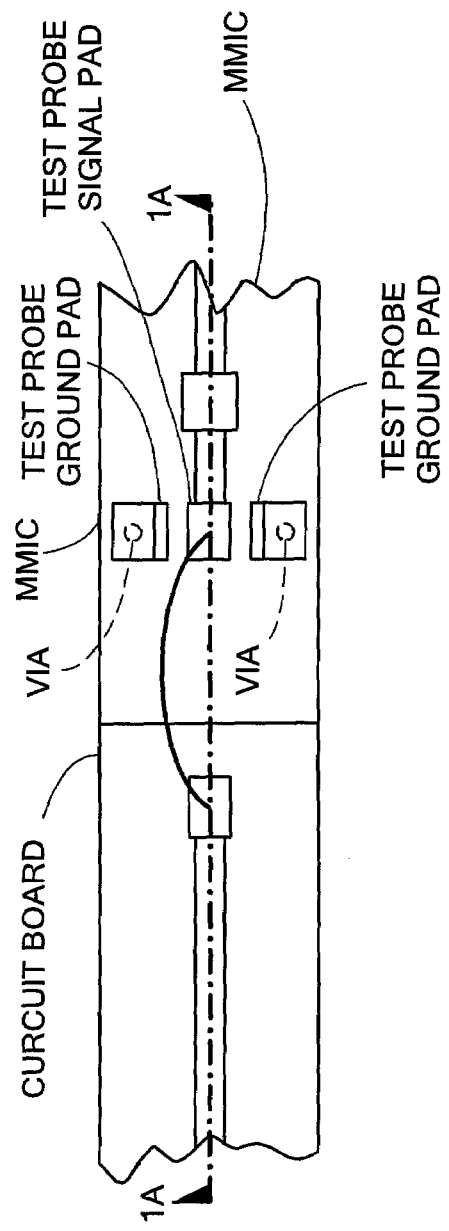
*FIG. 1A* Prior Art
*FIG. 1B* Prior Art

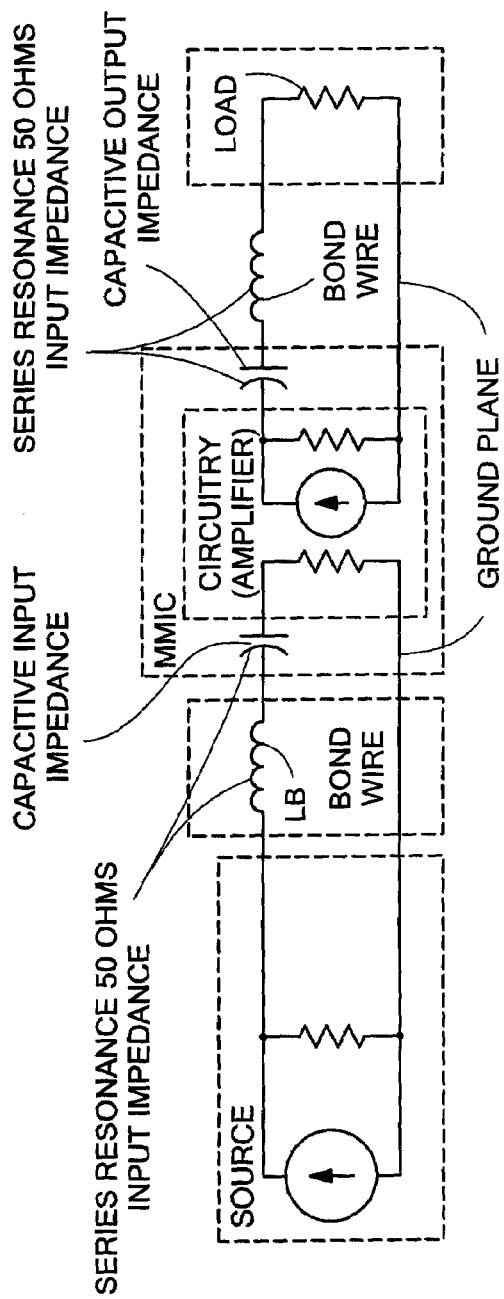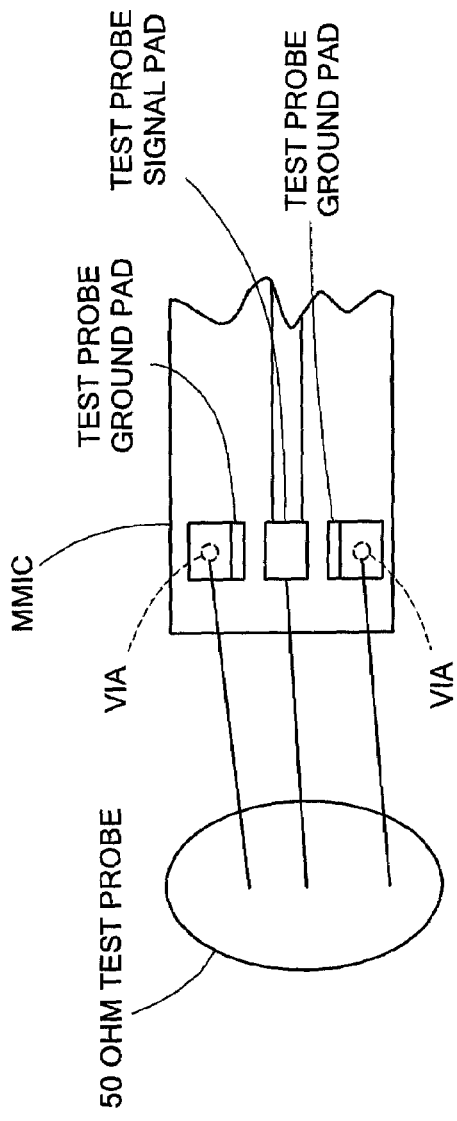
FIG. 1C
Prior Art
FIG. 1D
Prior Art

TUNED MMIC PROBE PADS

TECHNICAL FIELD

This invention relates generally to monolithic microwave integrated circuits (MMIC) and more particularly to MMICs configured for testing using an impedance matched probe.

BACKGROUND

As is known in the art, when a MMIC (a chip) is coupled to an input circuit board using a bond wire, such as shown in FIGS. 1A–1B, the MMIC is formed with a capacitive input impedance (FIG. 1C) in order to compensate for the inductance of the bond wire. The capacitance of the capacitive input impedance is selected in accordance with the inductance of the bond wire to create a series resonant L-C circuit with the result that real, typically 50 ohm, input impedance is presented to the source. Likewise, the MMIC is formed with a capacitive output impedance (FIG. 1C) to compensate for the inductance of the bond wire used to couple the output of the MMIC to the load presented by the circuit board. The capacitance of the capacitive output impedance is, as with the input impedance, selected in accordance with the inductance of the bond wire to create a series resonant L-C circuit with the result that real, typically 50 ohm, output impedance is presented to, in this case, the load.

As is also known in the art, during manufacturing of the MMIC, and before connected of the MMIC to the board or load, it is frequently necessary to test the MMIC. That is, high frequency Microwave Monolithic Integrated Circuits (MMIC's) must be radio frequency (rf) tested "on-wafer" prior to separating the die (i.e., chip) for bonding into modules, packages or circuit boards. Both large signal and small signal testing are carried out using commercially available probes. A typical test probe (FIG. 1D) has a 50 ohm impedance at the tips of the probes. Further, during the testing, since the circuit board is absent, the bond wire is also absent, as shown in FIGS. 1D and 1E. Thus, during the on-wafer testing, there is an impedance mismatch between the test probe and the MMIC being tested (i.e., the inductance of the bond wire is not present during the pre-die testing yet the MMIC still has the capacitive input impedance and capacitive output impedance used to compensate for the anticipated bond wire inductance).

More particularly, typical MMIC designs are aimed at nominal 50 ohm input and output characteristic impedance. This is achieved with MMIC microstrip by having a center conductor separated from the ground plane by the semiconductor dielectric. In a fixture, the center conductor is bonded to a pad on the mounting substrate. As shown in FIGS. 1A–1C, the bond wire and associated bonding pad form an inductance that can be significant at high frequency. In particular, at 44 GHz, the inductance of this bond wire must be accounted for in the MMIC design. FIG. 1C shows how an equivalent capacitive reactance is incorporated in the MMIC input and output matching network to cancel the bond wire inductance. To utilize probes for in-process probe test, the wafer is processed through thinning (typically to 50 microns for 44 GHz). Via holes minimally close to top ground pads pass through the thinned wafer. This results in a Ground-Signal-Ground (GSG) configuration as shown in FIG. 1D. The configuration provides a transition from 50 ohm co-planar probes to the microstrip on the MMIC. The line where the GSG probes contacts the MMIC, is intended to be 50 ohms. In the conventional probe pad design, there is no provision to correct for the bond wire inductance of the fixtured MMIC. Therefore, the MMIC, which still has the compensation capacitance for the absent bond wire inductance, is improperly tuned during probe test.

SUMMARY

In accordance with the present invention, a microwave integrated circuit chip is provided having microwave circuitry on the chip. A microwave transmission line is on the chip coupled to an input of the microwave circuitry. The microwave circuitry has a first reactive input impedance. A test probe ground pad is on the chip. A second reactive element is on the chip connected to the test probe and in circuit with the first reactive input impedance of the microwave circuitry to provide a resonance with the first reactive input impedance of the microwave circuitry.

With such an arrangement, the second reactive element provides a resonance with the first reactive input impedance of the microwave circuitry to thereby provide non-reactive input impedance to the chip.

In one embodiment, a microwave integrated circuit chip is provided having an input microwave transmission line coupled to an input of microwave circuitry. The microwave transmission line comprises: a substrate; a strip conductor disposed on a first surface of the substrate, such strip conductor having an input signal pad at one end thereof, and a ground plane disposed on a second, opposite surface of the substrate. The microwave circuitry has capacitive input impedance. The chip includes a via passing from the first surface of the substrate, through the substrate, to the ground plane. A test probe ground pad is disposed on the first surface of the substrate and is spaced from a portion of the via disposed on the first surface of the substrate. An electrical conductor is disposed on the first surface of the substrate extending from the portion of the via disposed on the first surface of the substrate to the test probe ground pad, such electrical conductor providing an inductive impedance selected to provide resonance with the capacitive input impedance of the microwave circuitry. Thus, there is an impedance match between the probe and the chip.

With such an arrangement, an on-wafer matching network that is consistent with commercially available probes is provided that does not perturb the basic MMIC functionality when it is mounted with a bond wire. The invention results in an improvement in the correlation between the rf probe data and that obtained in the final fixtured product. The result will be significantly improved yield of fixtured product.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1A is a cross sectional view of a circuit board connected to an MMIC according to the PRIOR ART;

FIG. 1B is plan view of the circuit board connected to an MMIC of FIG. 1A according to the PRIOR ART, the cross-section of FIG. 1A being taken along line 1A—1A of FIG. 1B;

FIG. 1C is an equivalent circuit of the MMIC-circuit board of FIG. 1A and includes an output circuit from the MMIC according to the PRIOR ART;

FIG. 1D shows the MMIC of FIG. 1B prior to dicing and connected to a test probe according to the PRIOR ART;

Like reference symbols in the various drawings indicate like elements.

DETAILED DESCRIPTION

Figure 2A:
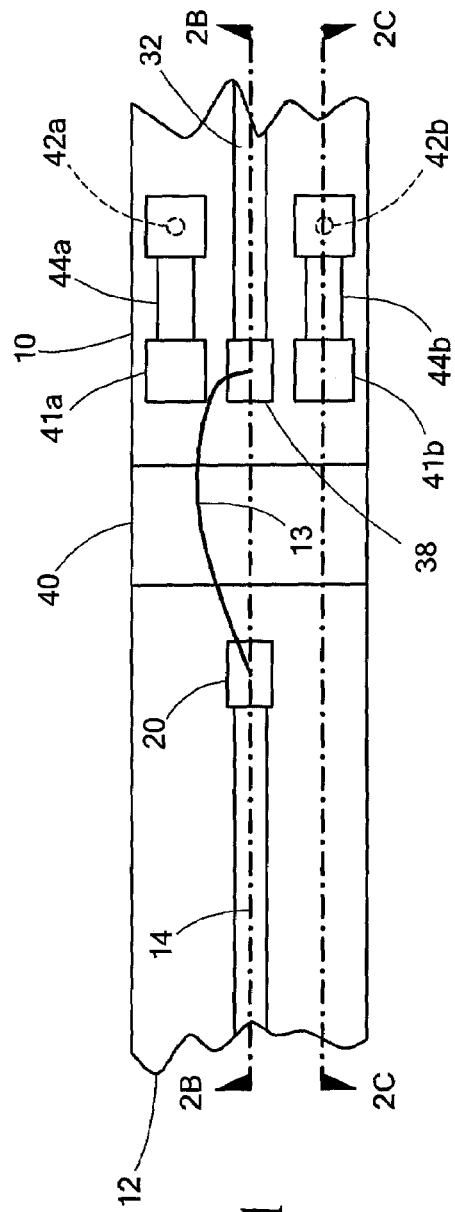
FIG. 2A is a plan view of the circuit board connected to an MMIC according to the invention.
Figure 2B:
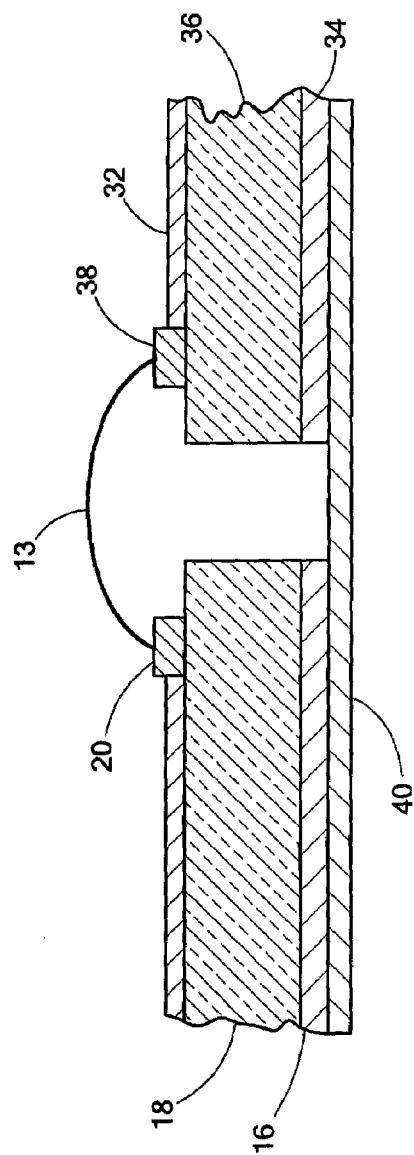
FIG. 2B is a cross sectional view of the circuit board connected to the MMIC according to the invention, such cross section being taken along line 2B—2B in FIG. 2A.
Figure 2C:
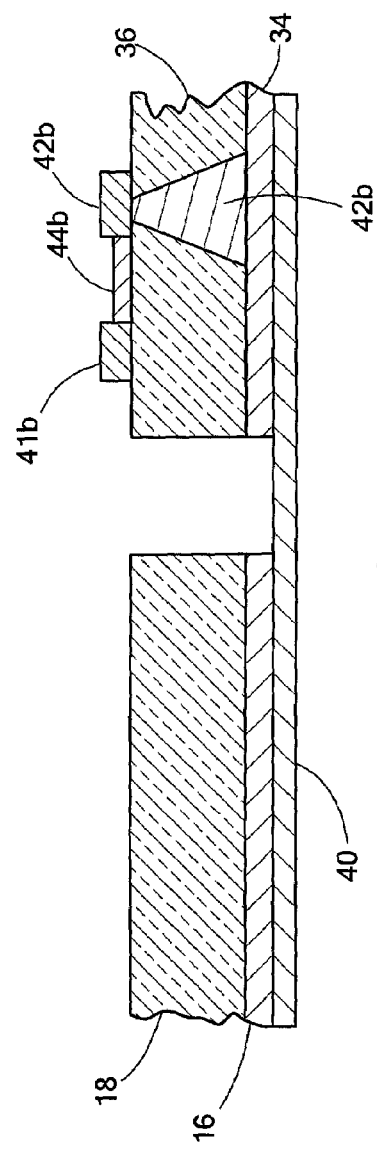
FIG. 2C is a cross sectional view of the circuit board connected to the MMIC according to the invention, such cross section being taken along line 2C—2C in FIG. 2A.

Referring now to FIGS. 2A, 2B and 2C, a microwave integrated circuit chip (i.e., a MMIC) 10 is shown coupled to a circuit board 12 by a bond wire 13. The circuit board 12 has a strip conductor 14 separated from a ground plane 16 by a dielectric substrate 18, as shown, to form a conventional microwave transmission line, here for example, microstrip transmission line. The strip conductor 14 terminates in a bond wire pad 20, as shown.

The MMIC 10 includes, in the signal input portion thereof, a strip conductor 32 separated from a ground plane 34 by a dielectric substrate 36, here a single crystal insulating or semi-insulating, materials such as GaAs, GaN, etc. The strip conductor 12 has at one end thereof a signal pad 38, such strip conductor 32 being coupled at the other end thereof to microwave circuitry 60, here for example, an amplifier, shown in the equivalent circuit of FIG. 2D. The ground planes 16, 34 are electrically and mechanically connected to an electrically conductive support 40, as shown in FIG. 2C.

The MMIC 10 also has formed therein electrically conductive test probe ground pads 41a, 41b used during testing of the MMIC 10 prior to separation of the MMIC 10 from the wafer, not shown, (i.e., prior to dicing), as will be described in more detail in connection with FIGS. 2E and 2F. Electrically conductive vias 42a, 42b are formed in the MMIC 10, such vias 42a, 42b pass from the upper surface of the substrate 36 to the ground plane 34, as shown more clearly in FIG. 2C. Strip conductors 44a, 44b are formed on the upper surface of the substrate 36 and extend between the electrically conductive test probe ground pads 41a, 41b, respectively, and the ends of the electrically conductive vias 42a, 42b, respectively that terminate at the upper surface of the dielectric 36, as shown more clearly in FIG. 2C.

Figure 2D:
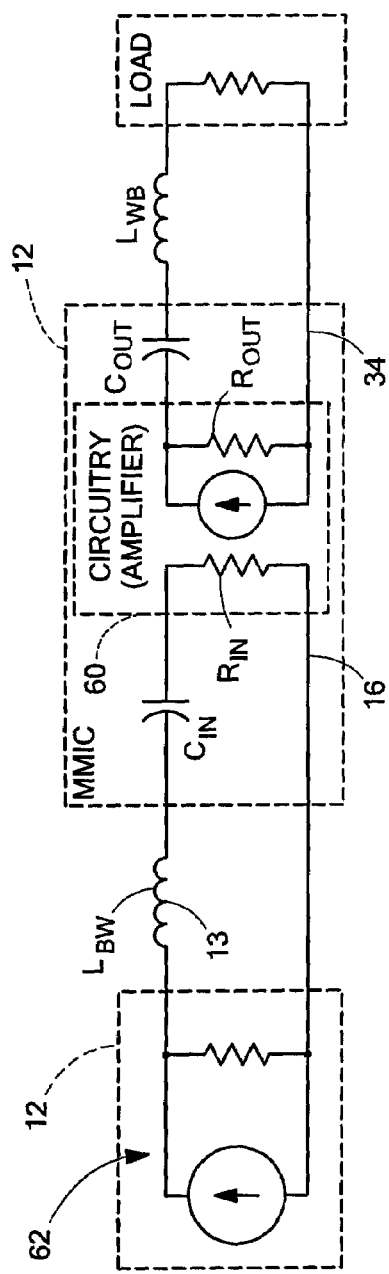
FIG. 2D is an equivalent circuit of the structure of FIG. 2A and includes an output circuit from the MMIC according to the invention.

The microwave circuitry 60 may be of any conventional type such as transistor amplifiers, etc, having a real input impedance represented by the resistor $R_{IN}$ in the equivalent circuit of FIG. 2D, suffice it to say here, however, that the input impedance of the MMIC 10 is formed with conventional capacitive input impedance, here represented schematically by input capacitor $C_{in}$ (FIG. 2D) to compensate for the inductance of the bond wire 13. More particularly, the capacitance $C_{in}$ of the capacitive input impedance is selected in accordance with the inductance $L_{BW}$ of the bond wire 13 to create a series resonant L-C circuit with the result that real, typically 50 ohm, input impedance of the MMIC 10 (represented by $R_{IN}$) is presented to a source 62 on board 12. Thus, the input impedance of the MMIC 10 includes a reactive element, here a capacitive reactance represented by the capacitor $C_{in}$ and the resistor $R_{IN}$. Thus the input impedance of the MMIC 10 may be represented as $R_{IN}+1/j[2\pi f (C_{IN})]$, where $j=\sqrt{-1}$ and where f is the nominal operating frequency of the MMIC 10. Likewise, the microwave circuitry 60 is formed with capacitive output impedance, here represented by input capacitor $C_{out}$ (FIG. 2D) selected to compensate for the inductance of the bond wire, not shown, used to couple the output of the MMIC 10 to the load presented by the circuit board. More particularly, the value of the capacitance, $C_{out}$ of the capacitive output impedance is selected in accordance with the inductance of the bond wire, $L_{BW}$, to create a series resonant L-C circuit with the result that real, typically 50 ohm, output impedance is presented to the load. Thus, as shown in FIG. 2D, the source 62 sees an impedance which may be represented as: $R_{IN}+1/j2\pi f(C_{IN})]+j2\pi f(L_{BW})]$, where $j=\sqrt{-1}$ and where $[1/j2\pi f(C_{IN})]=-j2\pi f(L_{BW})]$; or $2\pi f=[(L_{BW}C_{IN})]^{-1/2}$. Thus, the input impedance to the MMIC 10 is real and may be represented as $R_{IN}$.

Figure 1E:
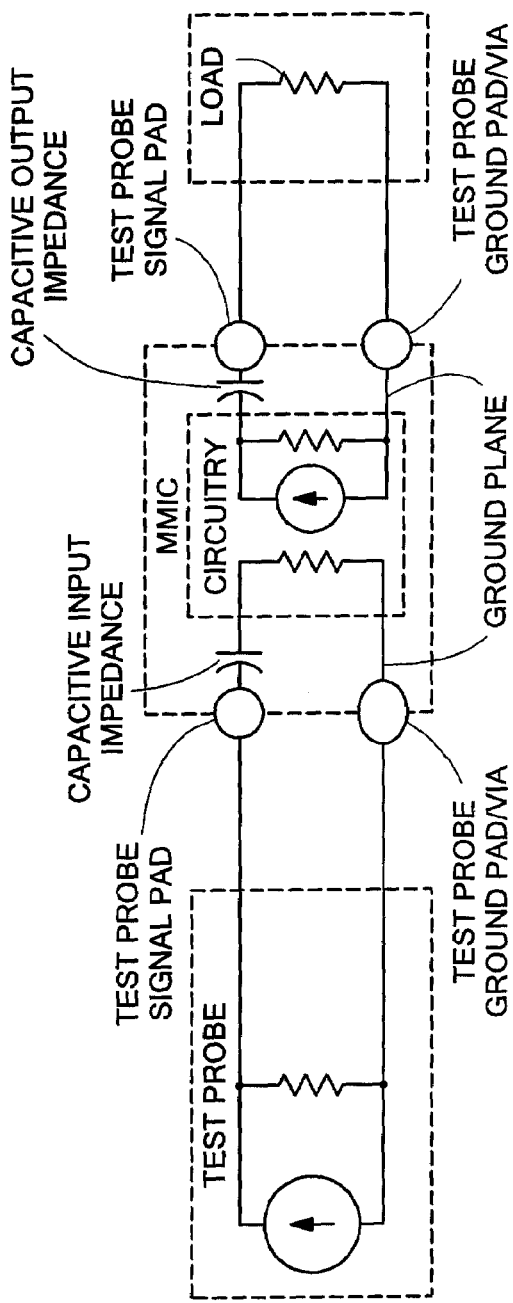
FIG. 1E is an equivalent circuit of the structure of FIG. 1D and includes an output circuit from the MMIC according to the PRIOR ART.
Figure 2E:
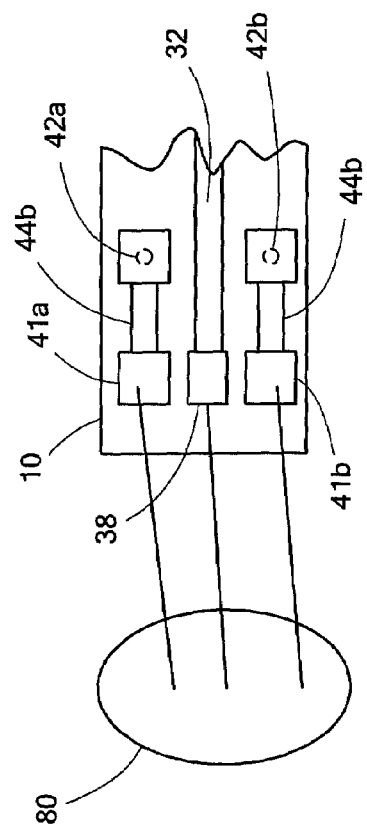
FIG. 2E shows the MMIC of FIG. 2A according to the invention prior to dicing and connected to a test probe according to the invention.
Figure 2F:
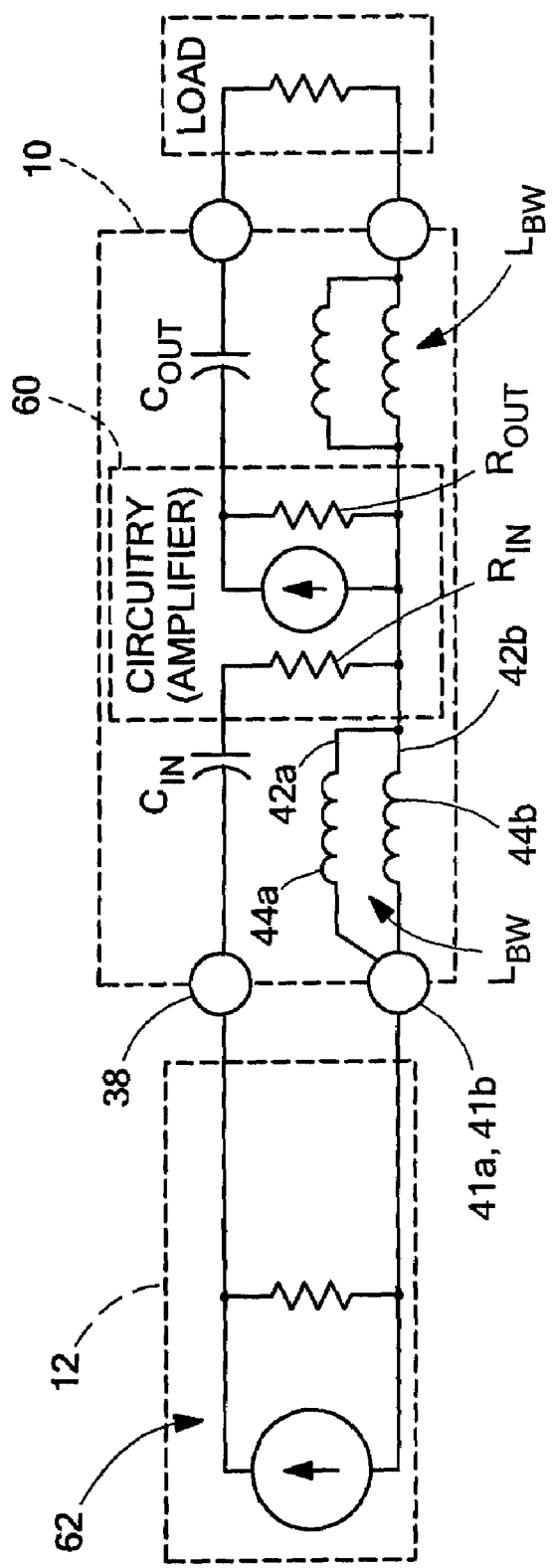
FIG. 2F is an equivalent circuit of the structure of FIG. 2E and includes an output circuit from the MMIC according to the invention.

Referring now to FIGS. 2E and 2F, the MMIC 10 is shown prior to separation from the wafer, not shown, and during testing of the un-diced MMIC. Here, a 50 ohm impedance GSG test probe test probe 80 is shown connected to the input signal pad 38 and the test probe ground pads 41a, 41b. Note that during testing the bond wire 13 is absent. It is to be noted that the each one of the strip conductors 44a, 44b is designed to provide an inductance $2L_{BW}$, such inductance being selected so that a series resonant circuit is formed with the input capacitance (represented in $C_{IN}$) of the microwave circuitry 60. Thus, the inductive reactance $2\pi f(L_{BW})$ cancels the capacitive reactance $1/[2\pi f(C_{IN})]$, where f is the nominal operating frequency of the MMIC 10. It is noted that conjugate match (i.e., resonance) is again obtained as with the circuit shown in FIG. 1E. An advantage of the approach of strip conductors 44a, 44b tuning is that the fixture mounted MMIC's is in no way changed by the tuned ground pads, since these pads are not used during bonded-in operation and are not directly connected to any circuit parts.

More particularly, it is noted from FIG. 2E that the strip conductors 44a, 44b provide inductive reactance which are effectively connected in parallel with each other between the test probe ground pads 41a, 41b respectively and the vias 42a, 42b, respectively, as represented in the equivalents circuit of FIG. 2F. Thus, the series circuit loop impedance between the signal pad 38 and the test probe ground pads 41a, 41b, may again be represented as: $R_{IN}+1/[j2\pi f(C_{IN})]+j2\pi f(L_{BW})]$, where $j=\sqrt{-1}$ and where $1/[j2\pi f(C_{IN})]=-j2\pi f(L_{BW})]$; or $2\pi f=[(L_{BW}C_{IN})]^{-1/2}$. Thus, the input impedance to the MMIC 10 is real and may be represented as $R_{IN}$.

A similar arrangement is provided at the output portion of the MMIC 10 as shown in the equivalent circuit in FIG. 2F.

A number of embodiments of the invention have been described. For example, while the microwave transmission line used above is microstrip transmission line, other microwave transmission lines may be used for example, strip transmission line or coplanar transmission lines may be used. Further, while the MMIC described above is described as being connected to the source 62 with a wire having an inductive reactance, the MMIC 10 and source 62 on the board 12 may be capacitively coupled in which case an inductive reactance would be provided on the MMIC 10 between the signal pad 38 and the amplifier circuitry 60. In this case, the inductive reactance 44a and 44b would be replaced by capacitive reactance. Thus, it will be understood that various modifications may be made without departing from the spirit and scope of the invention. Accordingly, other embodiments are within the scope of the following claims.

What is claimed is:

1. A microwave integrated circuit chip, comprising:
   microwave circuitry on the chip;
   microwave transmission line on the chip coupled to an input of the microwave circuitry;
   wherein the microwave circuitry has a first reactive input impedance;
   a test probe ground pad on the chip;
   an second reactive element on the chip connected to the test probe ground pad and in circuit with the first reactive input impedance of the microwave circuitry to provide a resonance with the first reactive input impedance of the microwave circuitry to provide a non-reactive input impedance to the chip.

2. The microwave integrated circuit chip recited in claim 1 wherein the first reactance is capacitive reactance and the second reactance is inductive reactance.

3. The microwave integrated circuit chip recited in claim 1 wherein the microwave circuitry is microstrip transmission line circuitry.

4. The microwave integrated circuit chip recited in claim 3 wherein the first reactance is capacitive reactance and the second reactance is inductive reactance.

5. A microwave integrated circuit chip, comprising:
   microwave circuitry having a capacitive input impedance;
   a microwave transmission line coupled to an input of the microwave circuitry, comprising:
      a strip conductor having an input signal pad at one end thereof;
      a ground plane; and
      wherein the strip conductor is separated from the ground plane by a dielectric;
   a test probe ground pad;
   an inductive element connected to the test probe ground pad and in series with the input impedance of the microwave circuitry to provide a resonance with the capacitive input impedance of the microwave circuitry.

6. A microwave integrated circuit chip, comprising:
   microwave circuitry having a capacitive input impedance;
   a microwave transmission line coupled to an input of the microwave circuitry, comprising:
      a substrate;
      a strip conductor disposed on a first surface of the substrate, such strip conductor having an input signal pad at one end thereof; and
      a ground plane disposed on a second, opposite surface of the substrate;
   a via passing from the first surface of the substrate, through the substrate, to the ground plane;
   a test probe ground pad disposed on the first surface of the substrate and spaced from a portion of the via disposed on the first surface of the substrate;
   an electrical conductor disposed on the first surface of the substrate extending from the portion of the via disposed on the first surface of the substrate via to the test probe ground pad, such electrical conductor providing an inductive impedance selected to provide a resonance with the capacitive input impedance of the microwave circuitry.

* * * * *

UNITED STATES PATENT AND TRADEMARK OFFICE
CERTIFICATE OF CORRECTION

PATENT NO. : 7,202,673 B1
APPLICATION NO. : 11/460311
DATED : April 10, 2007
INVENTOR(S) : Michael G. Adlerstein It is certified that error appears in the above-identified patent and that said Letters Patent is hereby corrected as shown below:

Title Page, Item (57) Abstract, line 1, delete "having microwave" and replace with --having a microwave--.

Col. 1, line 30, delete "before connected" and replace with --before connection--.

Col. 1, line 33, delete "(MMIC's)" and replace with --(MMICs)--.

Col. 2, line 61, delete "FIG. 1B is plan" and replace with --FIG. 1B is a plan--.

Col. 3, line 59, delete "respectively that" and replace with --respectively, that--.

Col. 4, line 31, delete "GSG test probe test probe 80" and replace with --GSG test probe 80--.

Col. 4, line 33, delete "testing the" and replace with --testing, the--.

Col. 4, line 34, delete "that the each one" and replace with --that each one--.

Col. 4, line 44, delete "MMIC's" and replace with --MMICs--.

Col. 4, lines 63-64, delete "used for example, strip transmission line" and replace with --used, for example, strip transmission lines--.

Col. 5, line 4, delete "reactance" and replace with --reactances--.

UNITED STATES PATENT AND TRADEMARK OFFICE
CERTIFICATE OF CORRECTION

PATENT NO. : 7,202,673 B1
APPLICATION NO. : 11/460311
DATED : April 10, 2007
INVENTOR(S) : Michael G. Adlerstein It is certified that error appears in the above-identified patent and that said Letters Patent is hereby corrected as shown below:

Col. 5, line 17, delete "an second" and replace with --a second--.

Signed and Sealed this

Fourteenth Day of October, 2008

JON W. DUDAS
*Director of the United States Patent and Trademark Office*